(12) United States Patent
Doussiere et al.

(10) Patent No.: US 10,008,828 B1
(45) Date of Patent: Jun. 26, 2018

(54) HIGH-EFFICIENCY SEMICONDUCTOR LASER

(71) Applicant: INTEL CORPORATION, Santa Clara, CA (US)

(72) Inventors: Pierre Doussiere, San Jose, CA (US); Jonathan K. Doylend, Morgan Hill, CA (US)

(73) Assignee: INTEL CORPORATION, Santa Clara, CA (US)

(*) Notice: Subject to any disclaimer, the term of this patent is extended or adjusted under 35 U.S.C. 154(b) by 0 days. days.

(21) Appl. No.: 15/392,875

(22) Filed: Dec. 28, 2016

(51) Int. Cl.
| H01S 5/22 | (2006.01) |
| H01S 5/12 | (2006.01) |
| H01S 5/343 | (2006.01) |
| H01S 5/065 | (2006.01) |
| H01S 5/30 | (2006.01) |

(52) U.S. Cl.
CPC ............. *H01S 5/22* (2013.01); *H01S 5/0651* (2013.01); *H01S 5/12* (2013.01); *H01S 5/2205* (2013.01); *H01S 5/3054* (2013.01); *H01S 5/34306* (2013.01)

(58) Field of Classification Search
CPC ........ H01S 5/22; H01S 5/2205; H01S 5/3054; H01S 5/34306; H01S 5/12
See application file for complete search history.

(56) References Cited

U.S. PATENT DOCUMENTS

| 6,018,540 A * | 1/2000 | Kinoshita ............. B82Y 20/00 372/34 |
| 7,272,161 B1 | 9/2007 | Chen et al. |
| 2003/0032297 A1 | 2/2003 | Lindstrom et al. |
| 2008/0219315 A1 | 9/2008 | Makino et al. |
| 2009/0092165 A1 | 4/2009 | Sakai |
| 2012/0008895 A1 | 1/2012 | Sumi et al. |

OTHER PUBLICATIONS

International Search Report and Written Opinion dated Feb. 13, 2018 for International Application No. PCT/US2017/063475, 9 pages.

\* cited by examiner

*Primary Examiner* — Dung Nguyen
(74) *Attorney, Agent, or Firm* — Schwabe, Williamson & Wyatt, P.C.

(57) ABSTRACT

Embodiments of the present disclosure may relate to a hybrid silicon distributed feed-back (DFB) laser, wherein light is to propagate through the DFB laser along a length of the DFB laser. The DFB laser may include a mesa with a current channel that extends from the first side of the mesa to the second side of the mesa. At a first location along the length of the DFB laser, the current channel may have a first width and/or the mesa may have a second width. At a second location along the length of the DFB laser, the current channel may have a third width and/or the mesa may have a fourth width as measured in a direction perpendicular to the length of the DFB laser. Other embodiments may be described and/or claimed.

17 Claims, 10 Drawing Sheets

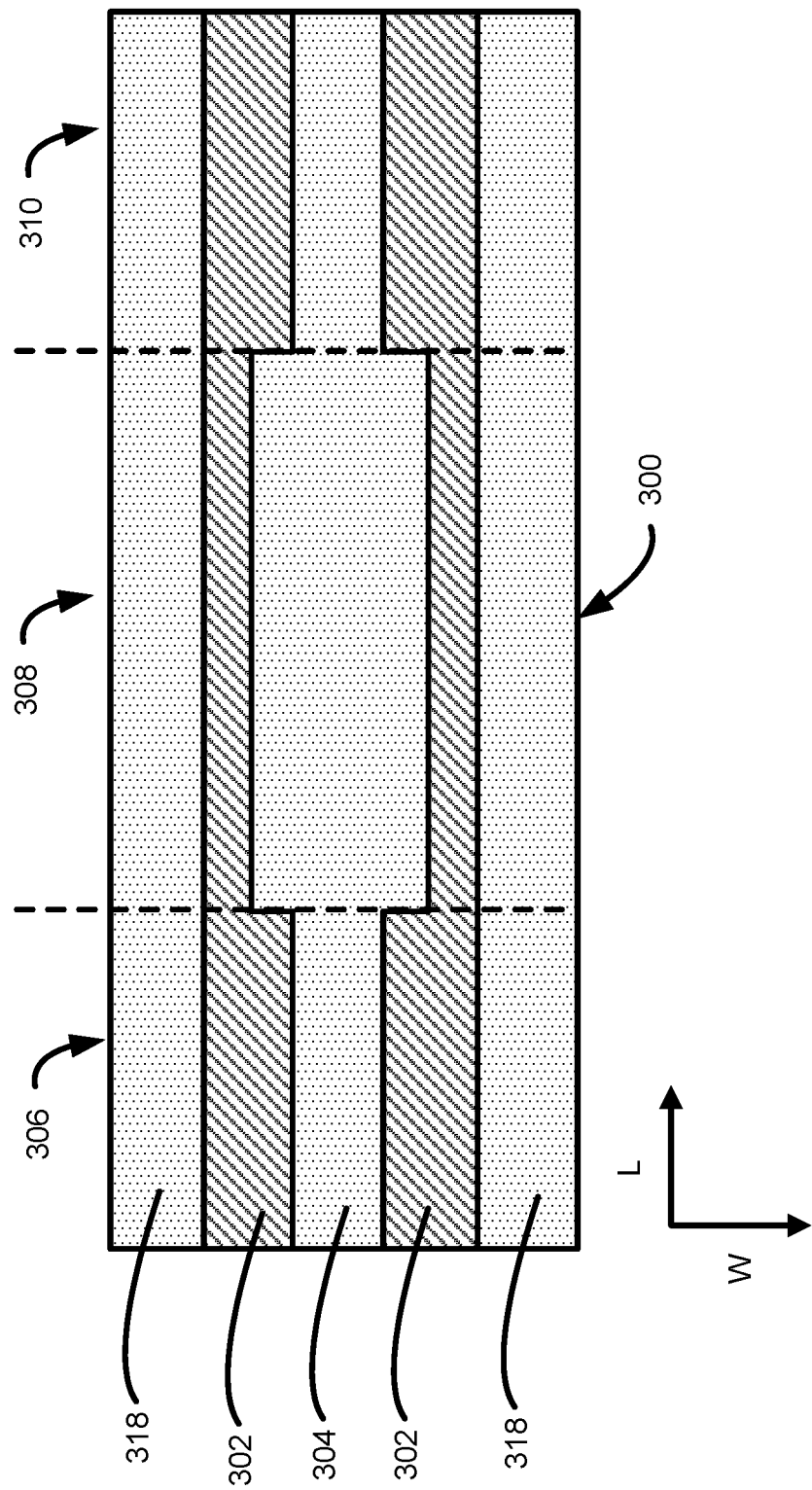
Figure 3-A

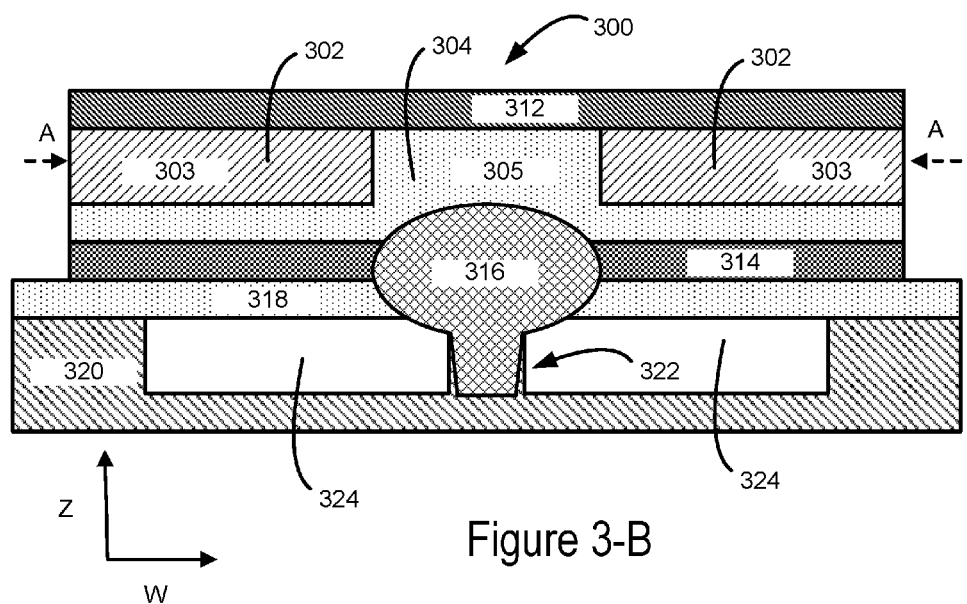
Figure 3-B
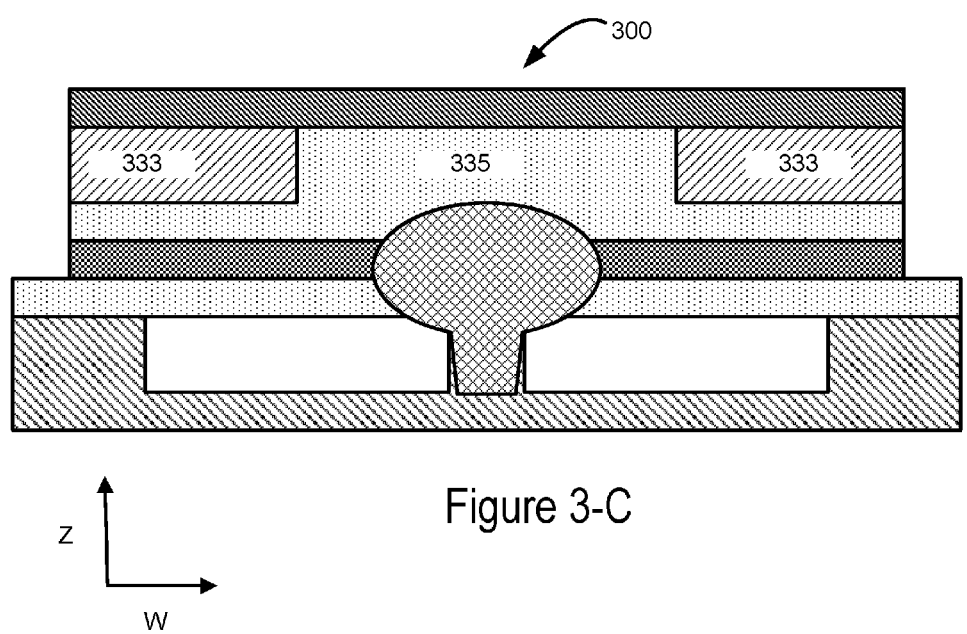
Figure 3-C

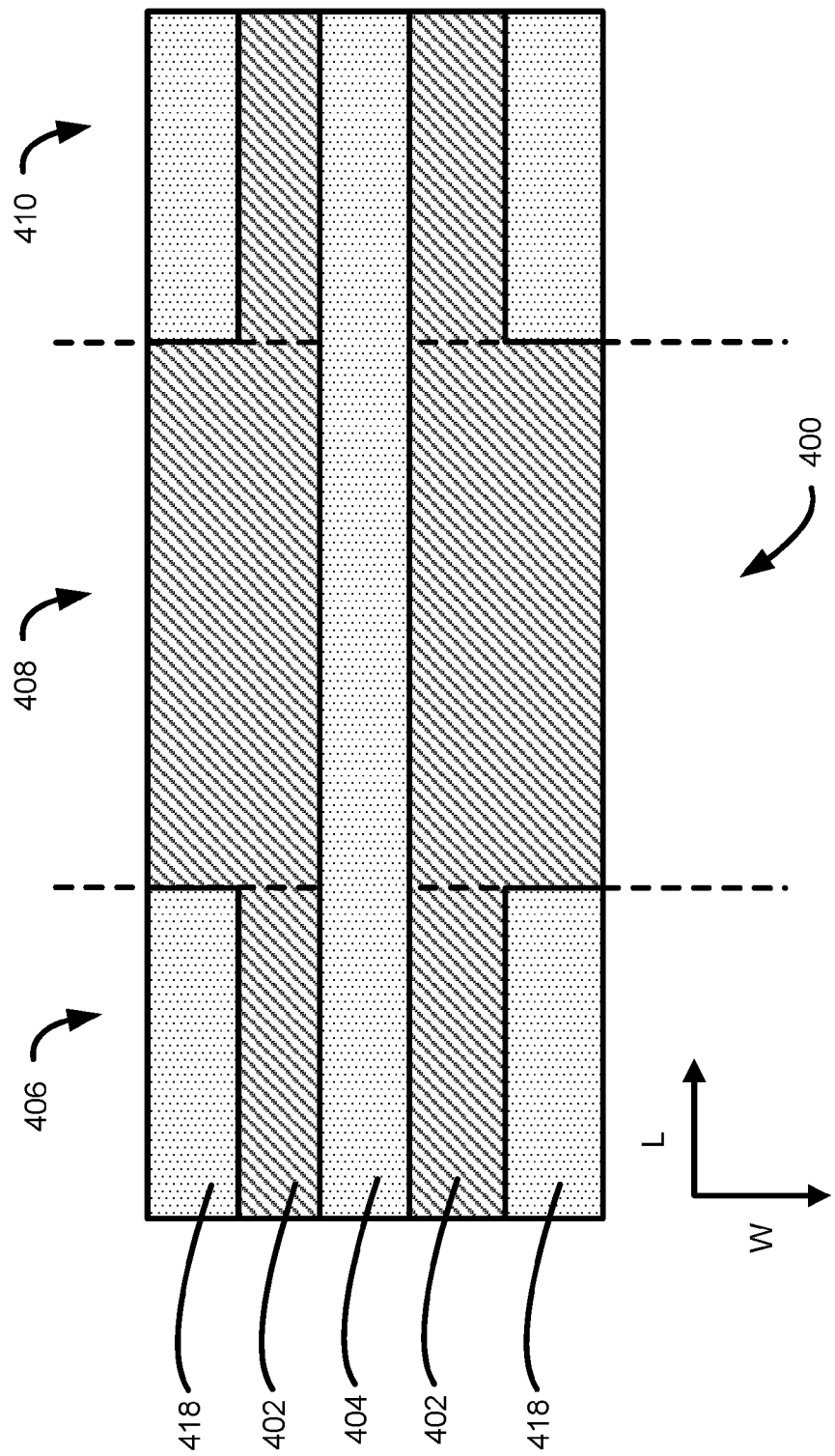
Figure 4-a

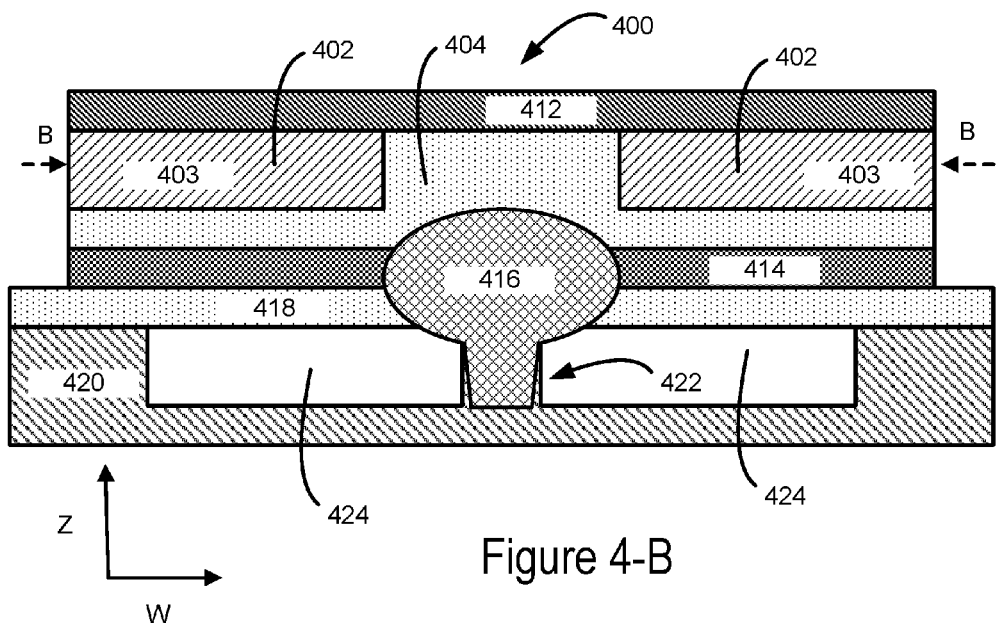
Figure 4-B
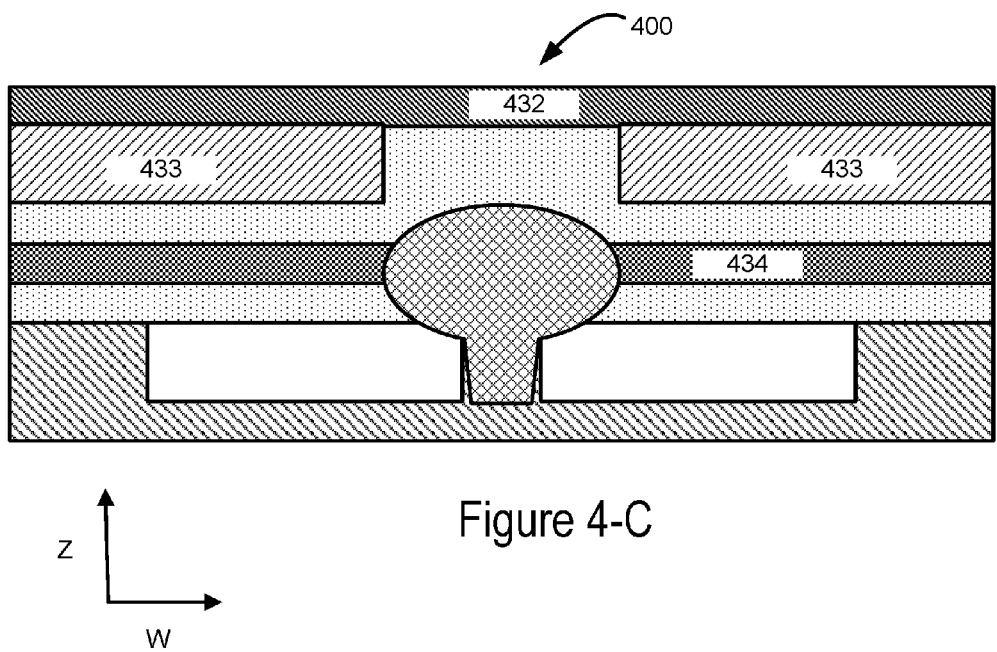
Figure 4-C

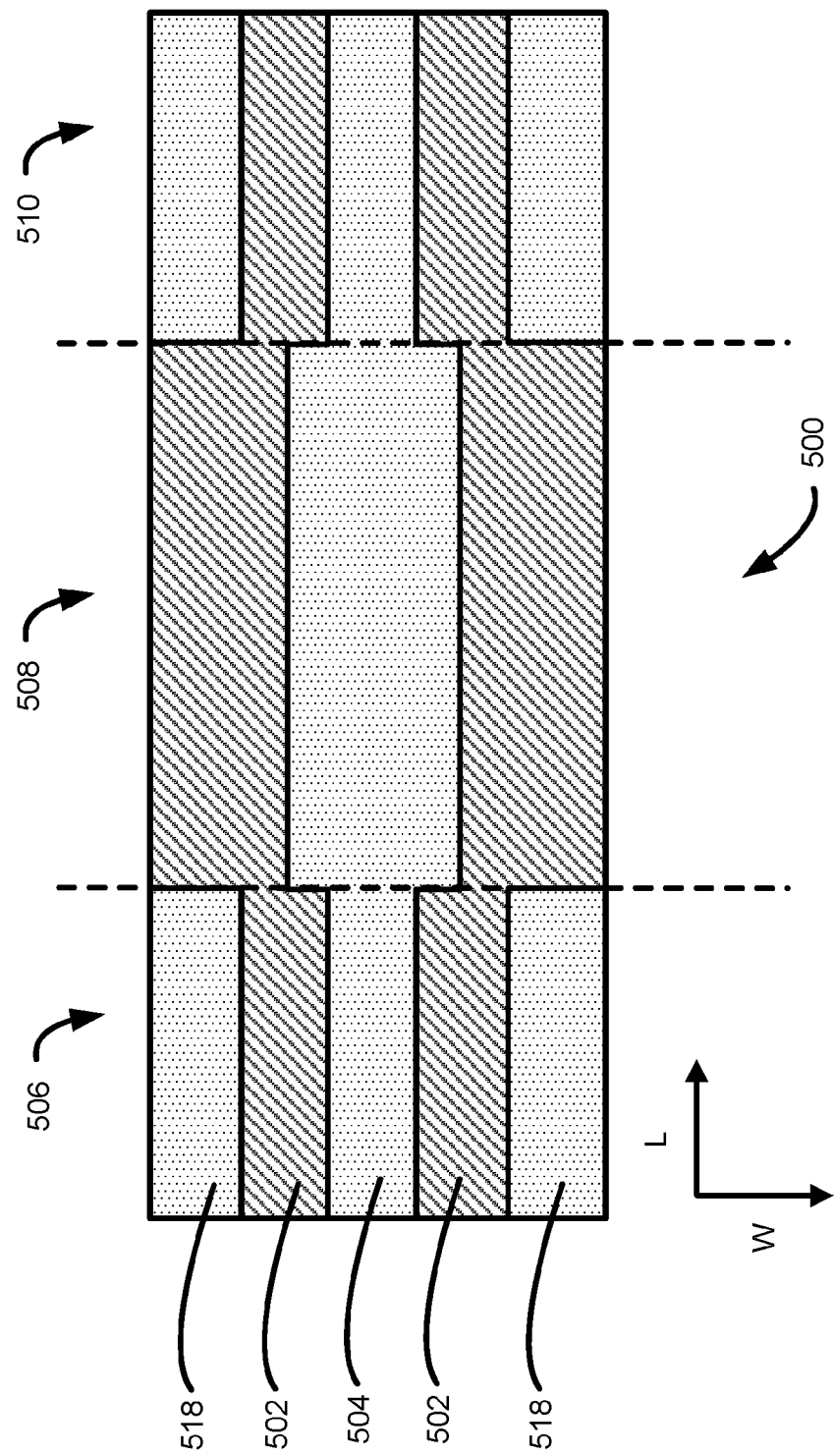
Figure 5-a

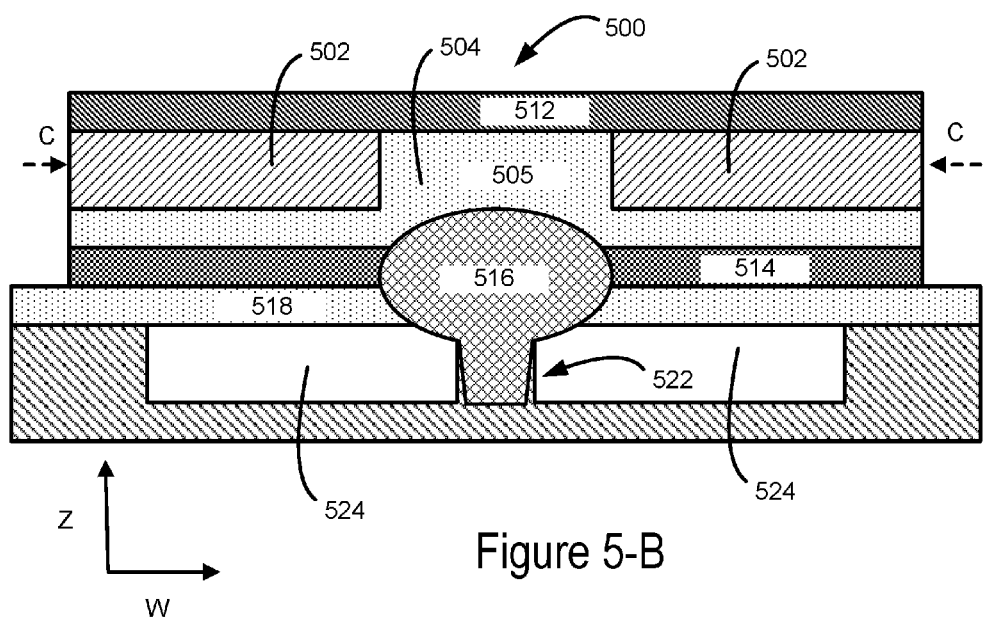
Figure 5-B
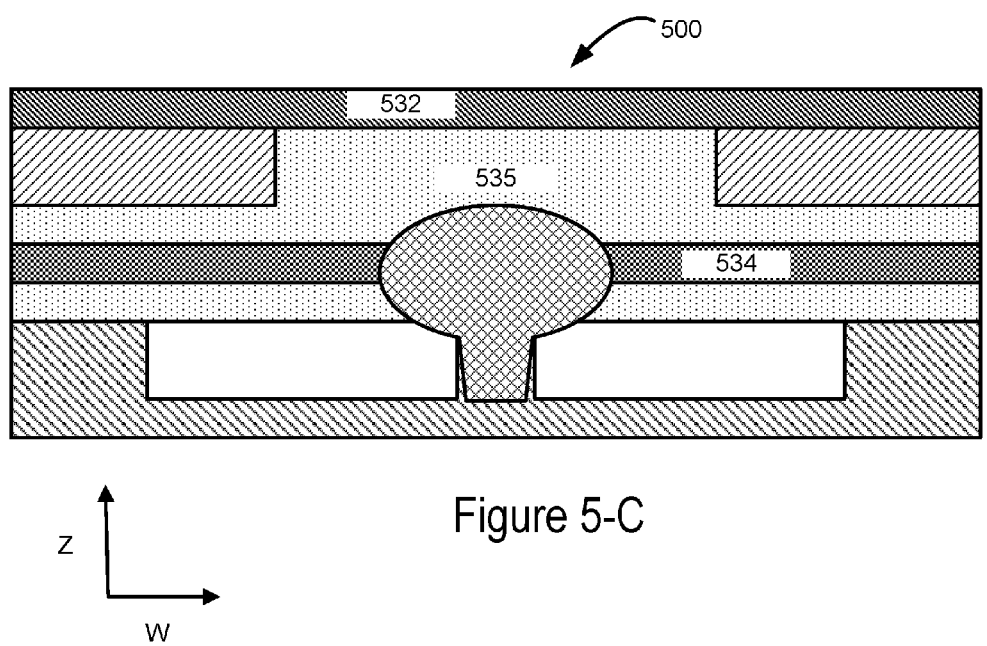
Figure 5-C

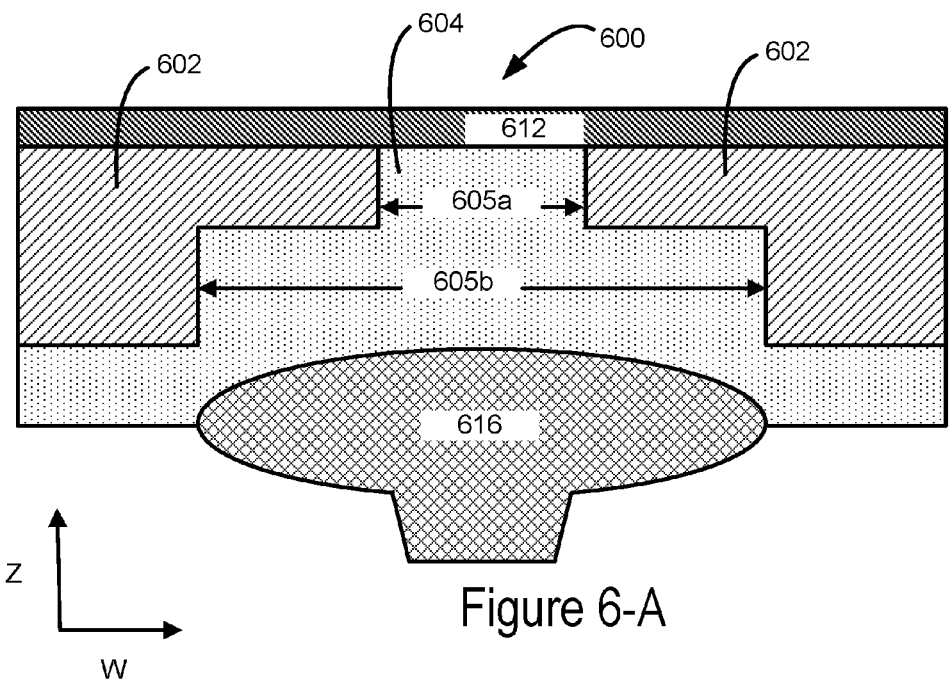
Figure 6-A
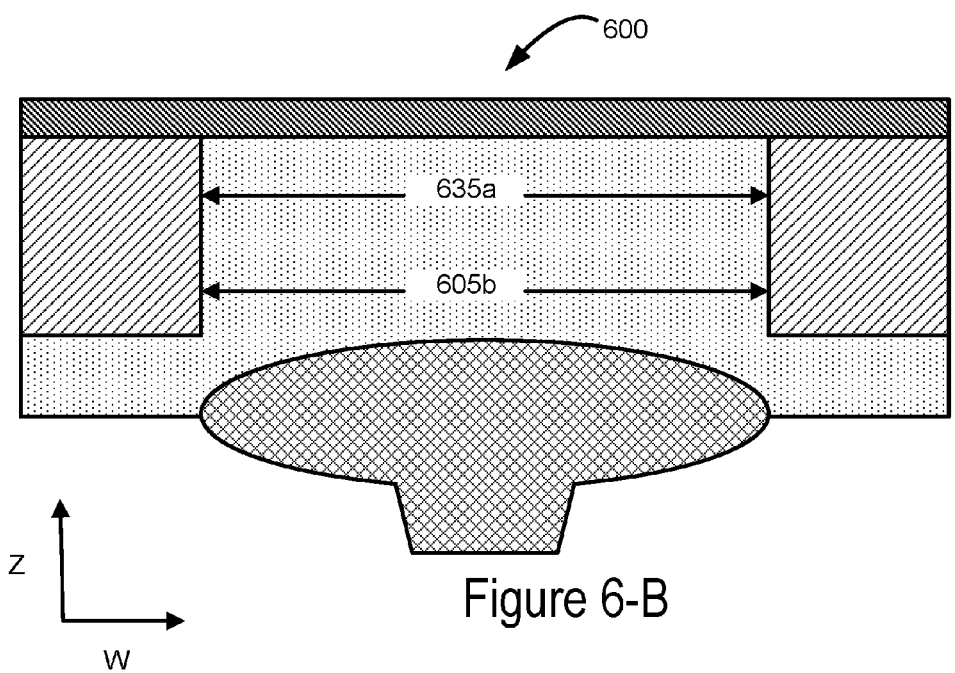
Figure 6-B

HIGH-EFFICIENCY SEMICONDUCTOR LASER

FIELD

Embodiments of the present disclosure generally relate to the field of increasing efficiency in, and purifying the spectral output of, lasers.

BACKGROUND

Lasers may be used as components in transmitters for digital communications products. It may be useful for the laser to operate within as small an electrical power budget as possible, while providing sufficient optical power to span the communication link with low bit-error rate. The efficiency of the laser may therefore be important for the transmitter with respect to cost and/or power considerations. It is also useful for the laser to operate with a relatively high spectral purity, that is, with an output that is highly localized around one optical wavelength. This spectral purity may be desirable because emission at multiple optical wavelengths may introduce bit errors due to optical dispersion and/or wavelength-dependent modulation.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 3-A, 3-B, and 3-C depicts an example DFB laser, in accordance with embodiments herein.

FIGS. 4-A, 4-B, and 4-C depict an alternative example DFB laser, in accordance with embodiments herein.

FIGS. 5-A, 5-B, and 5-C depict an alternative example DFB laser, in accordance with embodiments herein.

FIGS. 6-A and 6-B depict a cross-sectional view of an alternative example DFB laser, in accordance with embodiments herein.

DETAILED DESCRIPTION

Figure 1:
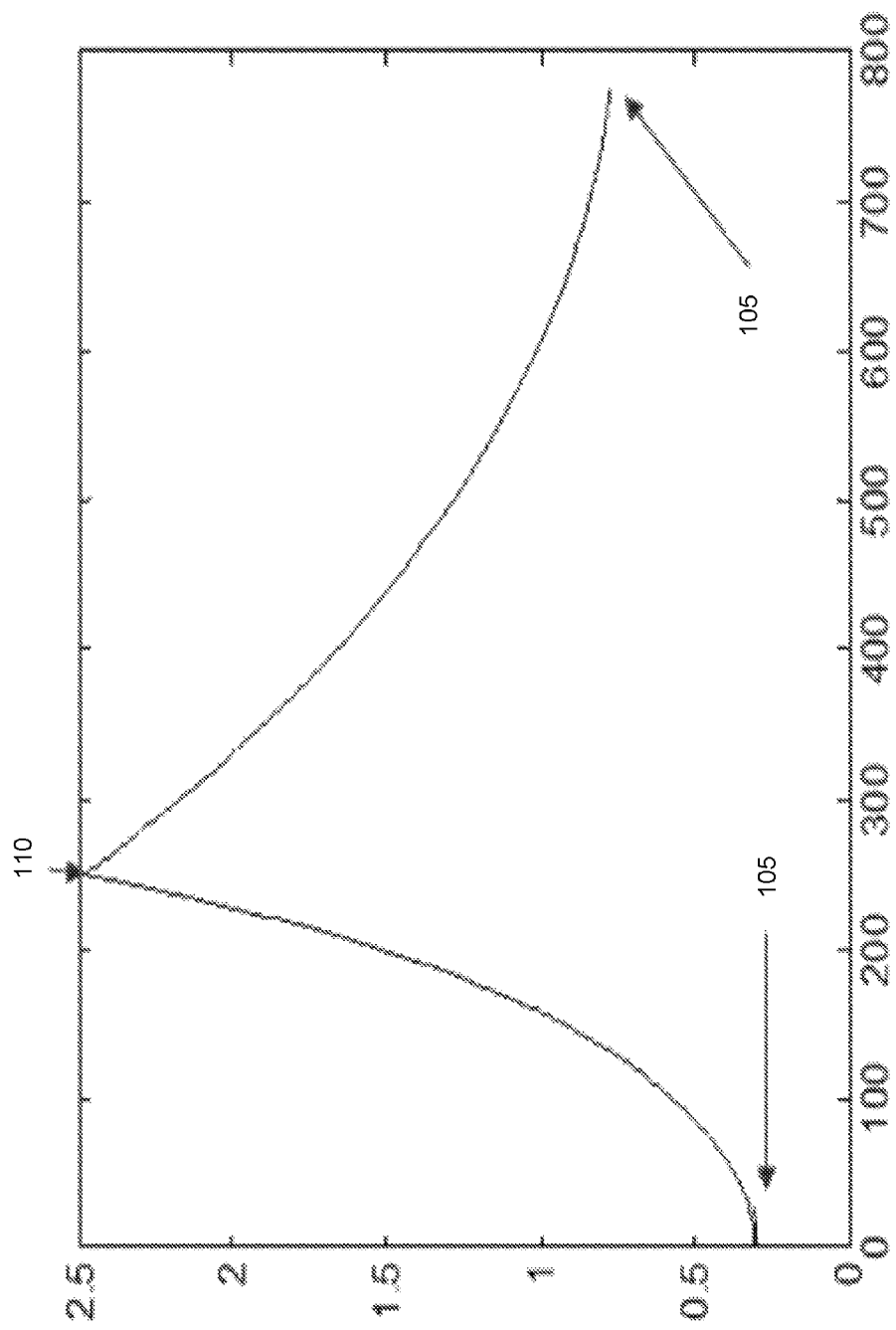
FIG. 1 depicts an example of optical field magnitude along the length of a distributed feed-back (DFB) laser cavity.

Generally, laser efficiency may be determined in part by the appropriate matching of electrical charge injection to stimulated photon density within the optical cavity. This matching may help ensure that electrical current is not wasted in regions of the cavity where there are not enough photons with which the current may interact. Efficiency may therefore be improved by applying a longitudinal resistance profile to the laser cavity in order to achieve this matching.

In a DFB laser, this matching may be helpful as there may be a large variation in photon density along the length of the laser. As used herein, a DFB laser may refer to a type of laser diode, quantum cascade laser or optical fiber laser where the active region of the device is periodically structured as a diffraction grating. In embodiments, the DFB laser may also be referred to as a "hybrid silicon" DFB laser. Specifically, the diffraction grating may be formed of a periodically structured layer which is located underneath the active region of the DFB laser. It will be understood that although embodiments herein are described with respect to a DFB laser, in other embodiments the concepts described herein may be applied to alternative laser types.

Embodiments herein may include one or more techniques to assist with this matching of charge injection to stimulated photon density. One such technique may be the "variable current channel" as described herein. The variable current channel may modulate the current along the laser cavity so as to inject increased current where the optical field is higher, and less where the optical field is lower. The variable current channel may modulate the current by varying the resistance per unit length along the length of the laser cavity. Since injected current density may be proportional to bias voltage and the inverse of resistance per unit length, varying the resistance along a particular portion of the laser (e.g. by varying the width of the electrode used to feed current into the laser junction along that length) may vary the injected current density along the length of the laser. In this way, the variable current channel may help increase the efficiency of electrical-carrier injection within the waveguide of the laser.

In some embodiments, the variable current channel may be useful when the DFB is designed with a Bragg grating. A Bragg grating, which may have a high reflectivity and/or high coupling coefficient, may yield a relatively uneven optical field along the laser cavity particularly as overall reflectivity is increased (e.g. to increase tolerance to external optical reflections), which in turn may degrade the efficiency of the laser at converting electrical carriers to photons. The variable current channel may therefore allow design of a laser that is both highly tolerant to external optical feedback, and offer a low operating bias current.

In some embodiments, the laser may also experience a non-uniform temperature across the later. In some embodiments this non-uniform temperature may be due, for example, to a non-uniform current injection, e.g., as may be caused by the variable current channel approach. In other embodiments the non-uniform temperature may be due to some other cause. The non-uniform temperature may introduce a non-uniform optical index and/or a corresponding degradation in single-mode performance of the laser, i.e. the laser emission may contain multiple "peaks" in wavelength such that it may have a relatively low overall side-mode suppression. The "variable mesa" technique described herein may mitigate this performance degradation and enable the above-described benefits of the variable current channel technique, while reducing the disadvantages introduced by the non-uniform heating. In other embodiments the "variable mesa" may be used to compensate for other thermal non-uniformities along the length of the laser, independent of whether a variable current channel is used.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first layer formed, deposited, or otherwise disposed on a second layer" may mean that the first layer is formed, deposited, grown, bonded, or otherwise disposed over the second layer, and at least a part of the first layer may be in direct contact (e.g., direct physical and/or electrical contact) or indirect contact (e.g., having one or more other layers between the first layer and the second layer) with at least a part of the second layer.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

As noted above, a DFB laser may refer to a type of laser diode where the diffraction grating is formed of a periodically structured layer which is located underneath the active region. Generally, DFB lasers may be characterized by a non-flat optical field along their cavity. This non-flat optical field may be the result of distributed reflectivity of the Bragg Grating used within the DFB laser, and may be particularly pronounced in quarter wave shift (QWS) DFBs when the coupling coefficient of the grating is high, as is sometimes accomplished in order to increase their tolerance to external optical feed-back.

Generally, in a hybrid silicon laser, a silicon-on-insulator (SOI) rib or ridge structure may be attached or bonded to a gain chip comprised of one or more layers of III-V material (e.g. Indium Phosphide and related ternary and quaternary materials which may be fabricated in a layer stack with it). The III-V gain chip may include a p-doped layer, a multiple quantum well/barrier stack (MQW), and an n-doped layer, together with metal features electrically connected to the n and p-type III-V to form a diode. When attached to the SOI structure together with a grating (e.g. a grating pattern etched into the SOI rib/ridge) the overall assembly may form a DFB laser diode in which light is confined laterally by the SOI rib/ridge, and vertically by the layer stack comprising silicon and III-V, and receives gain from the carriers injected into the MQW.

FIG. 1 depicts an example distribution of electrical field along the cavity for a typical asymmetric QWS DFB. Specifically, the x axis depicts the position along the length of the cavity of the DFB laser in micrometers (um). The y axis depicts the relative intensity of the optical field within the cavity. As can be seen in FIG. 1, the optical field may be at its maximum at the location of the phase shift near a midpoint 110 of the DFB laser, while the intensity of the optical field may be significantly lower near the ends 105 of the DFB laser. As used herein, and unless specifically stated otherwise, the term "midpoint" generally refers to an interior portion of the DFB laser with respect to the cavity. Unless specifically stated otherwise, "midpoint" is not intended to refer to the exact middle of the DFB laser cavity. The variations in optical intensity may be even greater than the variations in optical field depicted in FIG. 1, as optical intensity is generally proportional to the square of the optical field within the laser.

Figure 2:
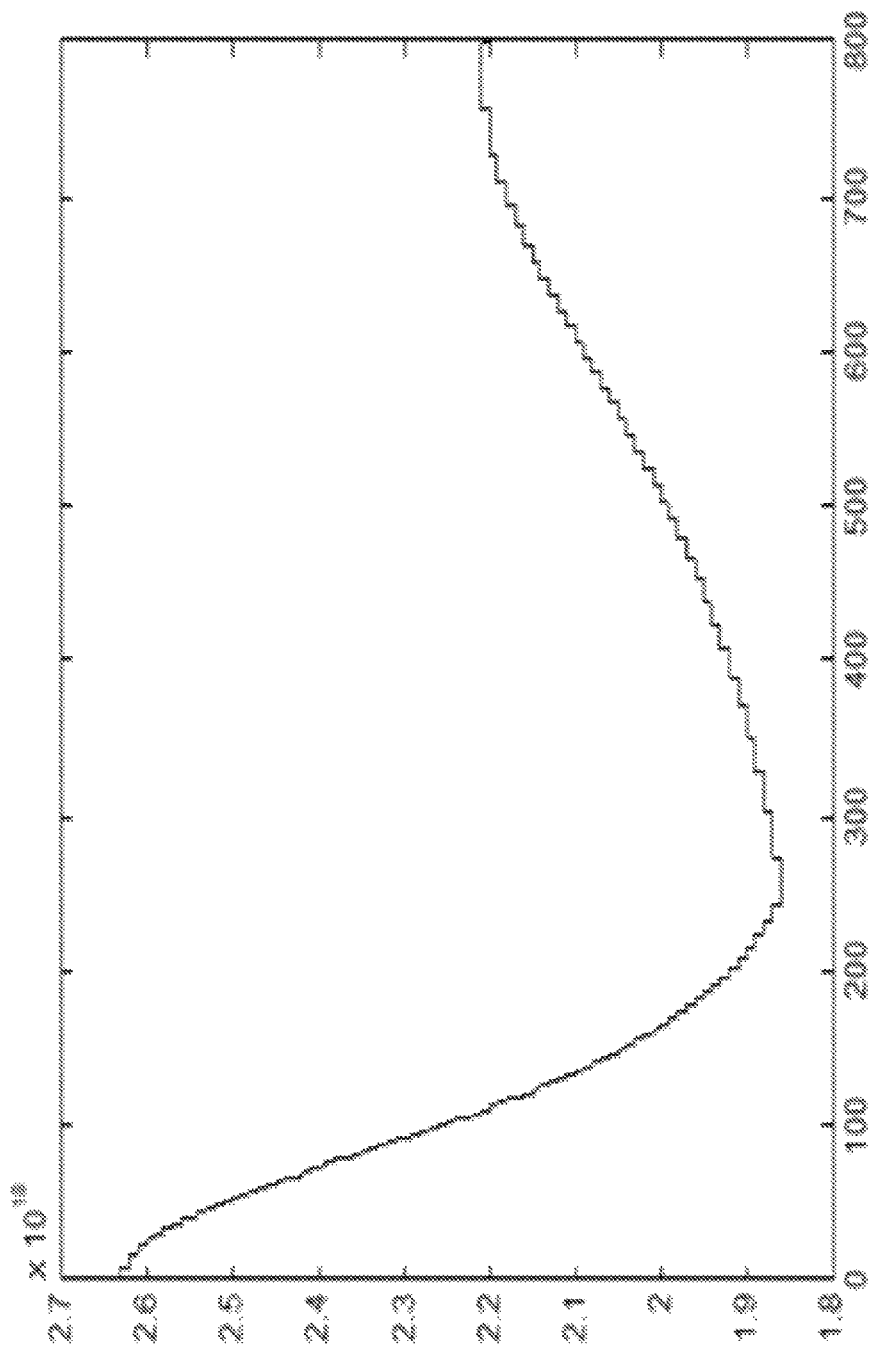
FIG. 2 depicts an example of carrier density along the length of a DFB laser cavity.

In the case of a legacy non-variable current channel, the current may be injected relatively evenly along the cavity of the DFB laser. As a result, the efficiency of conversion of current to photons with the laser cavity may vary significantly along the cavity. This variance may be due to the need for extra current in areas where the optical field (or photon density) is low. By contrast, areas where photon density is high (e.g., near the midpoint of the cavity), may not get enough current. The resulting carrier density may therefore inversely mirror the optical field density/photon density of the laser. FIG. 2 depicts an example of carrier density along the length of a DFB laser cavity. The x axis, similarly to FIG. 1, depicts the position along the length of the cavity of the DFB laser in um. The y axis depicts carrier density per cubic centimeter of the DFB laser cavity. As can be seen, the carrier density may be relatively high near the ends of the DFB laser, while the carrier density may be lower near the midpoint of the DFB laser cavity.

As noted earlier, injection of relatively high amounts of current where the photon density is low (e.g., near the midpoint of the DFB laser cavity) may result in a relatively high carrier density. The high carrier density may be considered detrimental to efficiency of the DFB laser since it becomes unused current, and therefore may contribute to electrical power consumption without contributing to optical power output, thus resulting in a degradation of overall efficiency. More specifically, the carrier density may favor loss of carriers above the semiconductor double-heterojunction that confines the carrier in the active layer. Generally, improving the match between the current injection profile and the photon density profile may yield a flatter carrier density and consequently improve electrical/optical conversion efficiency.

Embodiments herein, for example the above described variable current channel and/or variable mesa may provide a way to remedy the poor matching of current injection to photon density profile in a Si III-V hybrid DFB semiconductor laser.

Variable Current Channel

FIGS. 3-A through 3-C depict various views of a DFB laser 300 for a hybrid silicon laser, wherein a III-V gain medium is bonded on top of a silicon-on-insulator (SOI) waveguide. Specifically, FIG. 3-A depicts a top-down view of the DFB laser 300 along the plane indicated by line A-A in FIG. 3-B. The DFB laser 300 may have a length (indicated by L) and a width (indicated by W). Generally, light may propagate through the DFB laser 300 along the length L of the DFB laser 300. As shown in FIG. 3-A, the DFB laser 300 may have two end portions 306 and 310, and a midportion 308. The DFB laser 300 may further include a current channel 304, and a resistive region such as proton implant portions 302 adjacent to the current channel 304. As can be seen in FIG. 3-A, the width of the current channel 304 may be greater at the midportion 308 than at the end portions 306 or 310. The DFB laser 300 may also include an n-contact layer 318, which is explained in greater detail below.

FIG. 3-B depicts an example cross-sectional view of the DFB laser 300, for example at end portion 306 or 310. FIG. 3-C depicts an example cross-sectional view of the midportion 308. Elements of FIG. 3-B are not re-labeled in FIG. 3-C for the sake of clarity. Generally, FIGS. 3-B and 3-C may have a height (indicated by Z) and a width (indicated by W, which may also indicated the same axis as the width W in FIG. 3-A).

The DFB laser 300 may include the current channel 304 and the proton implant portions 302 adjacent to the current channel. Generally, the current channel 304 and the proton implanted portions 302 may be parts of the "mesa" of the wave-guide. The "mesa" may further include the p-contact layer 312 and a layer that includes one or more quantum well(s) 314, described in greater detail below. In embodiments, the current channel 304 may be made up of a III-V material such as Indium Phosphide (InP) or some other III-V material. Generally, the proton implanted portions 302 may also be made of a III-V material, which may be the same material or different material as the current channel 304. The proton implanted portions 302 may differ, though, from the current channel 304 in that the proton implanted portions 302 may be implanted with additional protons which may give the proton implanted portions 302 a higher resistivity. More specifically, the proton implanted portions 302 may be subjected to Hydrogen proton bombardment, which may render the p-doped III-V material electrically non-conductive, thereby forcing current to flow through the current channel 304. These more highly resistive implanted portions 302 may serve to funnel positively charged carriers through the current channel 304 as will be explained in greater detail below.

The DFB laser 300 may further include a p-contact layer 312. The p-contact layer 312 may include some electrically conductive material such as copper, gold, or some other material. In general, the p-contact layer 312 may couple with an current source such as one or more current supplies, and receive positive charge carriers which are then introduced to the current channel 304.

The DFB laser 300 may further include an n-contact layer 318 with a layer that includes one or more quantum well(s) 314 positioned between the current channel 304 and the n-contact layer 318. The n-contact layer 318 may be made of the same or a different III-V material than the current channel 304. Specifically, in embodiments the n-contact layer 318 may be formed of a III-V material that is n-doped. The n-contact layer 318 may be coupled with a current source that is able to inject electrons into the DFB laser 300. Generally, the layer that includes one or more quantum well(s) 314 may serve to cause the energy from the electrons to be converted to photons which amplify an optical mode 316 that propagates along the length L of the DFB laser 300. Although only a single quantum well is shown in FIGS. 3B and 3C, in other embodiments the DFB laser 300 may include a plurality of quantum wells.

The DFB laser 300 may further include an SOI platform 320. The SOI platform 320 may include a plurality of cutout portions 324, with a pedestal section 322 positioned there between. The cutout portions 324 and the pedestal 322 may extend the length of the DFB laser 300. Generally, the pedestal 322 may help constrain the optical mode 316 within the width W of the DFB laser 300, thereby laterally confining the optical mode 316 along the length L of the DFB laser 300.

As can be seen in FIGS. 3-B and 3-C, the current channel 304 and/or the proton implanted potions 302 may have different widths at different locations along the length of the DFB laser 300. For example, as noted above FIG. 3-B may correspond to a cross-sectional view of the DFB laser 300 at end portion 306 or 310. FIG. 3-C may correspond to a cross-sectional view of the DFB laser 300 at midportion 308. As can be seen in FIGS. 3-B and 3-C, the current channel 305 of FIG. 3-B may have less width (i.e., be narrower) than the current channel 335 of FIG. 3-C. Similarly, the proton implanted portions 333 of FIG. 3-C may be narrower than the proton implanted portions 303 of FIG. 3-B.

This different width may have the result of making the current channel 304 wider at the midportion 308 of the DFB laser 300 than the end portions 306 or 310. In this way, increased current may be supplied to the current channel 304 at locations where carriers are being most aggressively consumed (as shown, for example, in FIG. 2). This increased charge at the regions of high carrier consumption may serve to flatten out the carrier density profile depicted in FIG. 2 such that the variation between the maximum and minimum carrier density profile may be significantly reduced, thereby improving efficiency of the DFB laser 300.

It will be understood that although the DFB laser 300 is shown as only have 3 portions, in some embodiments the amount of current injected locally to a current channel may be proportional to the width of the current channel. Therefore, varying the current channel along the DFB laser cavity may allow the current channel to be shaped along the cavity. In some embodiments, the current channel may include more or fewer than 3 distinct sections, each with a different width. In some embodiments, the current channel may not include distinct sections with different widths, but may be a single section with a continuously variable width.

Variable Mesa

FIGS. 4-A through 4-C depict various views of an alternative DFB laser 400 for a DFB laser. Specifically, FIG. 4-A depicts a top-down view of the DFB laser 400 along the plane indicated by line B-B in FIG. 4-B. The DFB laser 400 may have a length (indicated by L) and a width (indicated by W). Generally, light may propagate through the DFB laser 400 along the length L of the DFB laser 400. As shown in FIG. 4-A, the DFB laser 400 may have two end portions 406 and 410, and a midportion 408. The DFB laser 400 may further include a current channel 404, and proton implant portions 402 adjacent to the current channel 404. As can be seen in FIG. 4-A, the width of the current channel 404 may be greater at the midportion 408 than at the end portions 406 or 410.

FIG. 4-B depicts an example cross-sectional view of the DFB laser 400, for example at end portion 406 or 410. FIG. 4-C depicts an example cross-sectional view of the midportion 408. Elements of FIG. 4-B are not re-labeled in FIG. 4-C for the sake of clarity. Generally, FIGS. 4-B and 4-C may have a height (indicated by Z) and a width (indicated by W, which may also indicated the same axis as the width W in FIG. 4-A).

As shown in FIGS. 4-A through 4-C, the DFB laser 400 may include elements similar to those of DFB laser 300 described above. Specifically, the DFB laser 400 may include proton implanted portions 402, current channel 404, p-contact layer 412, a layer that includes one or more quantum well(s) 414, optical mode 416, n-contact layer 418, SOI platform 420, pedestal 422, and cutout portions 424. These elements may be respectively similar to proton implant portions 302, current channel 304, p-contact layer 312, the layer that includes one or more quantum well(s) 314, optical mode 316, n-contact layer 318, SOI platform 320, pedestal 322, and cutout portions 324.

As can be shown in FIG. 4-C, the DFB laser 400 may also include p-contact layer 432, proton implanted portions 433, and a layer that includes one or more quantum well(s) 434, which may be respectively similar to p-contact layer 412, proton implanted portions 403, and the layer that includes one or more quantum well(s) 414. However, as can be seen, the width of the p-contact layer 432 may be greater than the width of the p-contact layer 412. Similarly, the width of proton implanted portions 433 may be greater than the width of proton implant portions 403. Similarly, the width of the layer that includes one or more quantum well(s) 434 may be greater than the width of the layer that includes one or more quantum well(s) 414.

This difference in width can be seen, for example, in the view of the DFB laser 400 shown in FIG. 4-A. As can be seen, the overall width of the mesa at the midportion 408 may be greater than the width of the mesa at the end portions 406 and 410. However, the width of the current channel 404 may be relatively constant along the length L of the DFB laser 400. In other embodiments, the width of the current channel 404 may vary as described in further detail below with respect to FIGS. 5A-5C. This variable width of the mesa may provide one or more benefits such as allowing heat generated within the current channel 404, the layer that includes one or more quantum well(s) 414, or elsewhere in the mesa (e.g. from Joule heating or from non-radiative recombination) to be spread across a larger area and therefore dissipated across a larger area to the substrate silicon. Thus the thermal impedance per unit length of the laser may be varied along its length in much the same way that electrical resistance can be, such that non-uniform thermal characteristics along the length of the laser may be compensated, in whole or in part, by adjusting the width of the mesa along the length of the laser.

Similarly to DFB laser 300, it will be understood that although the DFB laser 400 is shown as only have 3 portions, in some embodiments the DFB laser 400 may include more or fewer than 3 distinct portions, each with a different mesa width. In some embodiments, the DFB laser may not include distinct sections with different mesa widths, but may be a single section with a continuously variable mesa width.

Variable Current Channel and Variable Mesa

FIGS. 5-A through 5-C depict an example DFB laser 500 that may combine the benefits of DFB lasers 300 and 400. Specifically, DFB laser 500 may include both a variable current channel and a variable mesa.

FIGS. 5-A through 5-C depict various views of an alternative DFB laser 500 for a DFB laser. Specifically, FIG. 5-A depicts a top-down view of the DFB laser 500 along the plane indicated by line C-C in FIG. 5-B. The DFB laser 500 may have a length (indicated by L) and a width (indicated by W). Generally, light may propagate through the DFB laser 500 along the length L of the DFB laser 500. As shown in FIG. 5-A, the DFB laser 500 may have two end portions 506 and 510, and a midportion 508. The DFB laser 500 may further include a current channel 504, and proton implanted portions 502 adjacent to the current channel 504. As can be seen in FIG. 5-A, the width of the current channel 504 may be greater at the midportion 508 than at the end portions 506 or 510.

FIG. 5-B depicts an example cross-sectional view of the DFB laser 500, for example at end portion 506 or 510. FIG. 5-C depicts an example cross-sectional view of the midportion 508. Elements of FIG. 5-B are not re-labeled in FIG. 5-C for the sake of clarity. Generally, FIGS. 5-B and 5-C may have a height (indicated by Z) and a width (indicated by W, which may also indicated the same axis as the width W in FIG. 5-A).

As shown in FIGS. 5-A through 5-C, the DFB laser 500 may include elements similar to those of DFB lasers 300 or 400 described above. Specifically, the DFB laser 500 may include proton implanted portions 502, current channel 504, p-contact layer 512, a layer that includes one or more quantum well(s) 514, optical mode 516, n-contact layer 518, SOI platform 520, pedestal 522, and cutout portions 524. These elements may be respectively similar to proton implant portions 302/402, current channel 304/404, p-contact layer 312/412, the layer that includes one or more quantum well(s) 314/414, optical mode 316/416, n-contact layer 318/418, SOI platform 320/420, pedestal 322/422, and cutout portions 324/424.

However, as can be seen in FIGS. 5-A through 5-C, the DFB laser 500 may include the variable current channel depicted with respect to DFB laser 300. More specifically, the current channel 505 of FIG. 5-B (which corresponds to end portions 506 or 510 of FIG. 5-A) may be narrower than the current channel 535 of FIG. 5-C (which corresponds to midportion 508 of FIG. 5-A).

Similarly, the DFB laser 500 may include the variable mesa depicted with respect to DFB laser 400. More specifically, the overall width of the mesa of DFB laser 500 in FIG. 5-B may be narrower than the width of the mesa of DFB laser 500 in FIG. 5-C. More specifically, the width of p-contact 512 may be less than the width of p-contact 532. Similarly, the width of the layer that includes one or more quantum well(s) 514 may be less than the width of the layer that includes one or more quantum well(s) 534.

The inclusion of both the variable current channel and the variable mesa may provide synergistic benefits for DFB laser 500. For example, as described above the variable current channel may help to improve the efficiency of DFB laser 500 by reducing the variation between the maximum and minimum of the-carrier density profile in the DFB laser. However, in some embodiments the increased current caused by the wider current channel 535 may cause that portion of the DFB laser 500 to produce greater heat, and thereby experience greater thermal stress. However, as noted above with respect to DFB laser 400, the variable mesa may allow the DFB laser to dissipate a greater amount of heat. Therefore, if the mesa is widened in locations where the current channel is widened (e.g., as shown in FIG. 5-C), then the additional heat may be more easily dissipated.

Similarly to DFB lasers 300 or 400, it will be understood that although the DFB laser 500 is shown as only have 3 portions, in some embodiments the DFB laser 500 may include more or fewer than 3 distinct portions, each with a different mesa and/or current channel width. In some embodiments, the DFB laser may not include distinct sections with different mesa and/or current channel widths, but may be a single section with a continuously variable mesa and/or current channel width.

Dual Variable Current Channel

In some embodiments, it may be desirable for the width of the optical mode, e.g. optical modes 316, 416, or 516, to be chosen so as to match current density distribution of the DFB laser to a width of an optical mode of light that is to propagate through the waveguide of the laser. In some embodiments, this may be accomplished by setting the width of the optical mode to be approximately equal to the width of the charge profile produced by the base of the current channel. However, in embodiments that use a variable current channel, the optical mode width may not always be equal to the width of the current channel. As an example, the optical mode 316 of FIG. 3-B may have a width measured along axis W that is approximately equal to the width of the relatively narrower current channel 305. However, the width of the optical mode 316 may be significantly less than the width of the charge profile at the base of the current channel 335 shown in FIG. 3-C. This may cause current to be injected outside the optical mode, thereby reducing efficiency.

FIGS. 6-A and 6-B depict a mesa portion of an example DFB laser 600 that may resolve one or more of the above described results of the dissimilar width. Specifically, DFB laser 600 may include a current channel with both a constant portion along the length of the laser cavity and a variable portion along the length of the laser cavity.

Similarly to DFB lasers 300, 400, or 500, DFB laser 600 may include a length along which light would propagate. The length is perpendicular to the width (indicated by W) and the height (Z) of the DFB laser as indicated in FIGS. 6-A and 6-B. Elements of FIG. 6-A are not re-labeled in FIG. 6-B for the sake of clarity.

The DFB laser 600 may include elements similar to those of DFB lasers 300 or 400 described above. Specifically, the DFB laser 600 may include proton implant portions 602, current channel 604, p-contact layer 612, and optical mode 616, which may be respectively similar to proton implanted portions 302/402/502, current channel 304/404/504, p-contact layer 312/412/512, and optical mode 316/416/516. DFB laser 600 may further include additional elements depicted with respect to DFB lasers 300, 400, 500, which are not shown in FIGS. 6-A and 6-B for the sake of conciseness.

As can be seen in FIGS. 6-A and 6-B, though, the current channel 604 may include two layers. A first layer, adjacent to the p-contact 612, may have a first width indicated by 605a. The DFB laser 600 may include a second layer, positioned between the first layer and, for example, the optical mode 616 or an SOI platform (not shown), that may have a second width indicated by 605b.

As shown in FIG. 6-B, the width of the first layer may be varied to a different width 635a, while the width of the second layer 605b may remain relatively constant along the length of DFB laser 600. Notably, the width of the second layer 605b may be approximately the same as the width of the optical mode 616. In this way, the benefits of the variable current channel (for example as described with respect to DFB lasers 300 or 500) may be achieved, while resolving one or more of the above described results of the dissimilar width, described above. For example, FIG. 6-A may correspond to end portions of the DFB laser 600, for example end portions similar to end portions 306/310, or some other end portion described herein. FIG. 6-B may correspond to a midportion of the DFB laser 600, for example a midportion similar to midportion 308 or some other midportion described herein.

It will be understood that although width 635a is shown to be approximately equivalent to width 605b, in other embodiments width 635a may be greater or less than width 605b. Additionally, although two distinct layers are depicted in FIGS. 6-A and 6-B, in other embodiments DFB laser 600 may include more than two distinct layers with a variable current channel width. In some embodiments, the first and second layers may not be distinct, but rather may include a current channel with a continuously variable width along the length and height Z of the current channel. For example, the width may be approximately equivalent to width 605a, and then may increase according to a linear increase, a curve, or some other algorithm to width 605b in FIG. 6-A. In some embodiments the width 605b of the second layer may not be constant between FIGS. 6-A or 6-B, but rather the width of the second layer may vary. Similarly to DFB lasers 300/400/500, in some embodiments the width of the current channel may be continuously variable between the cross-section shown in FIG. 6-A and the cross-section shown in FIG. 6-B.

Generally, with respect to DFB lasers 300, 400, 500, or 600, it will be understood that the various depicted lengths, widths, and/or heights are intended only to be examples. Unless indicated otherwise, the ratios of various lengths/widths/heights are not intended to be limiting or indicate specific distance relationships between various depicted elements.

Alternative Embodiment

It will be understood that although some elements are described as having specific doping properties, in other embodiments the doping of certain elements or layers may be reversed. Using the DFB laser 300 of FIGS. 3-A through 3-C as an example, in some embodiments the p-contact layer 312 may be an n-contact layer while the n-contact layer 318 may be a p-contact layer. In this embodiment, the current channel 304 may be n-doped. Similarly, the proton implant portions 302 may not be proton-implanted, but rather may be some other form of resistive region that is designed to funnel current through the current channel 304.

Similar doping reversal may be applied to embodiments such as DFB lasers 400, 500, and/or 600.

Figure 7:
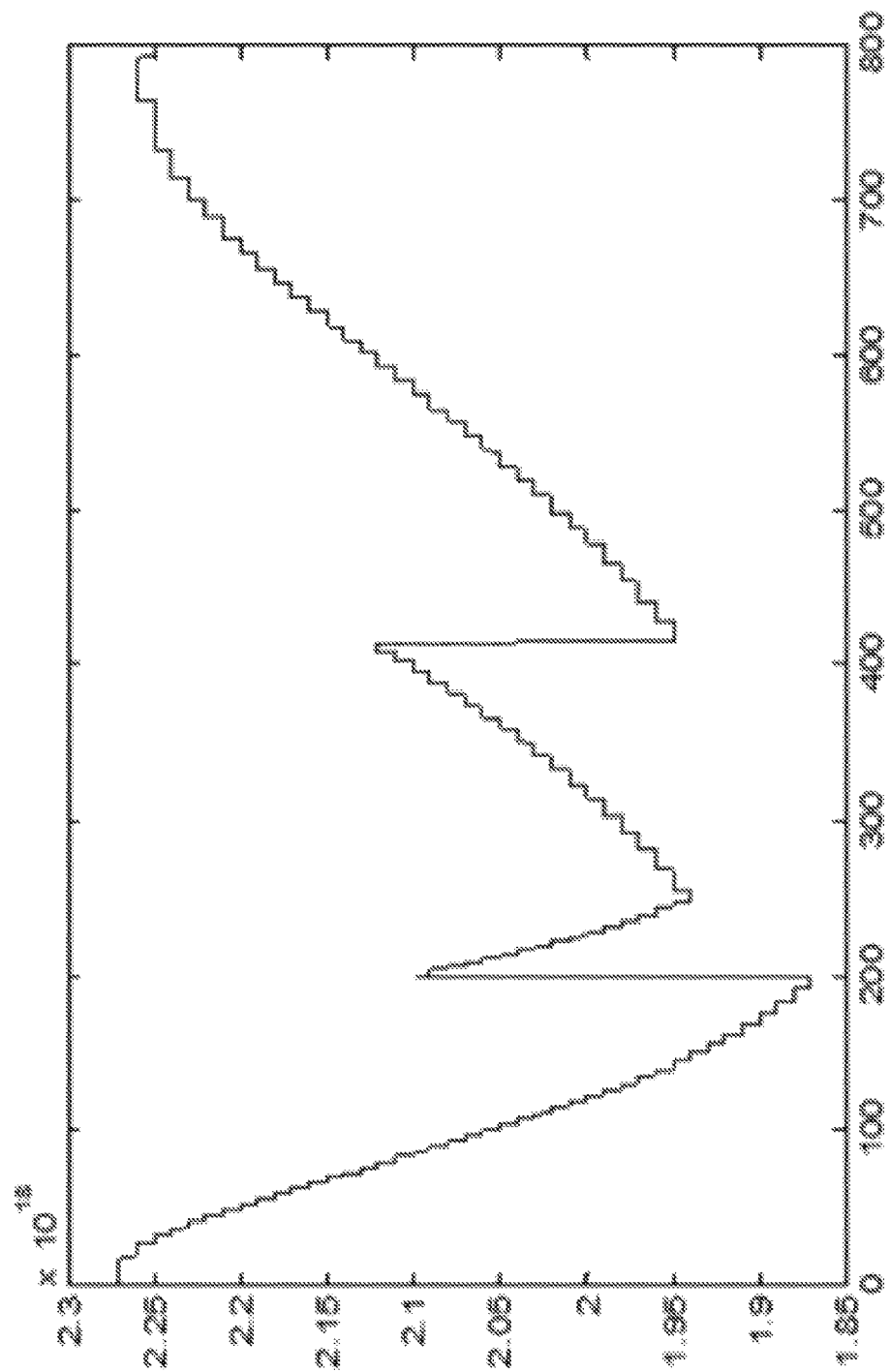
FIG. 7 depicts an example of a carrier density profile along the cavity of a DFB laser, in accordance with various embodiments.

FIG. 7 depicts an example of benefits of the above-described DFB lasers. More specifically, FIG. 7 depicts an example of carrier density along the length of a DFB laser cavity using a DFB laser such as one of DFB lasers 300, 400, 500, or 600. The x and y axes are labeled similarly to FIG. 2, described above.

As can be seen, the "dip" near the midportion of the DFB laser as shown in FIG. 2 may be reduced. This reduction may help equalize the carrier density along the length of the DFB laser cavity, thereby increasing the efficiency of the DFB laser.

EXAMPLES

Example 1 may include a distributed feed-back (DFB) laser, wherein light is to propagate through the DFB laser comprising: a contact; a silicon-on-insulator (SOI) platform; a mesa coupled with the SOI platform at a first side of the mesa, wherein the mesa further includes the contact at a second side of the mesa opposite the first side, and wherein the mesa further includes a current channel that extends from the first side of the mesa to the second side of the mesa, the current channel to convey injected current from the second side of the mesa to the first side of the mesa; wherein, at a first location along the length of the DFB laser, the current channel has a first width and the mesa has a second width as measured in a direction perpendicular to the length of the DFB laser; and wherein, at a second location along the length of the DFB laser, the current channel has a third width and the mesa has a fourth width as measured in a direction perpendicular to the length of the DFB laser.

Example 2 may include the DFB laser of example 1, wherein the mesa includes a III-V semiconductor material.

Example 3 may include the DFB laser of example 2, wherein the III-V semiconductor material includes indium phosphide (InP).

Example 4 may include the DFB laser of example 1, wherein the mesa further includes a resistive region adjacent to the current channel, wherein the resistive region is used to channel the current flow.

Example 5 may include the DFB laser of example 4, wherein the resistive region is a proton implanted portion.

Example 6 may include the DFB laser of any of examples 1-5, wherein the first width is greater than the third width, and the second width is greater than the fourth width.

Example 7 may include the DFB laser of example 6, wherein the first location is at a mid-section along the length of the mesa and the second location is at an end section along the length of the mesa.

Example 8 may include the DFB laser of any of examples 1-5, wherein the current channel includes a first layer adjacent to the second side of the mesa, and a second layer positioned between the first layer and the SOI platform, wherein the second layer has a fifth width that is substantially constant along the length of the waveguide.

Example 9 may include the DFB laser of example 8, wherein the fifth width is approximately identical to a width of an optical mode of light that is to propagate through the DFB laser.

Example 10 may include the DFB laser of any of examples 1-5, wherein the contact is a p-contact.

Example 11 may include a mesa for a hybrid silicon distributed feed-back (DFB) laser, wherein light is to propagate through the DFB laser along a length of a waveguide of the DFB laser, the mesa comprising: a first side; a second side opposite the first side; and a current channel that extends from the first side to the second side, the current channel to convey injected current from the first side of the mesa to the second side to the mesa; wherein, at a first location along the length of the waveguide, the current channel has a first width as measured in a direction perpendicular to the length of the waveguide; and wherein, at a second location along the length of the waveguide, the current channel has a second width as measured in a direction perpendicular to the length of the waveguide.

Example 12 may include the mesa of example 11, wherein the mesa includes a III-V semiconductor material.

Example 13 may include the mesa of example 12, wherein the III-V semiconductor material includes indium phosphide (InP).

Example 14 may include the mesa of example 11, further comprising a proton implanted portion adjacent to the current channel.

Example 15 may include the mesa of any of examples 11-14, wherein the first width is greater than the second width.

Example 16 may include the mesa of example 15, wherein the first location is at a mid-section along the length of the waveguide and the second location is at an end section along the length of the mesa.

Example 17 may include the mesa of any of examples 11-14, wherein the current channel includes a first layer adjacent to the first side of the mesa, and a second layer positioned between the first layer and the second side of the mesa, wherein the second layer has a third width that is substantially constant along the length of the waveguide.

Example 18 may include the mesa of example 17, wherein the third width is chosen so as to match current density distribution to a width of an optical mode of light that is to propagate through the waveguide.

Example 19 may include a mesa for a distributed feed-back (DFB) laser, wherein light is to propagate through the DFB laser along a length of a waveguide of the DFB laser, the mesa comprising: a first side; a second side opposite the first side; and a current channel that extends from the first side of the mesa to the second side of the mesa, the current channel to convey injected current from the first side of the mesa to the second side of the mesa; wherein, at a first location along the length of the waveguide, the mesa has a first width as measured in a direction perpendicular to the length of the waveguide; and wherein, at a second location along the length of the waveguide, the mesa has a second width as measured in a direction perpendicular to the length of the waveguide.

Example 20 may include the mesa of example 19, wherein the mesa includes a III-V semiconductor material.

Example 21 may include the mesa of example 20, wherein the III-V semiconductor material includes indium phosphide (InP).

Example 22 may include the mesa of example 19, wherein the mesa further includes a proton implanted portion adjacent to the current channel.

Example 23 may include the mesa of any of examples 19-22, wherein the first width is greater than the second width.

Example 24 may include the mesa of example 23, wherein the first location is at a mid-section along the length of the mesa and the second location is at an end section along the length of the mesa.

Example 25 may include the mesa of example 23, wherein the first width and the second width are based on a thermal impedance characteristic of the mesa at the first location and the second location.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A distributed feed-back (DFB) laser, wherein light is to propagate through the DFB laser comprising:
   a contact;
   a silicon-on-insulator (SOI) platform; and
   a mesa coupled with the SOI platform at a first side of the mesa, wherein the mesa further includes the contact at a second side of the mesa opposite the first side, and wherein the mesa further includes a current channel that extends from the first side of the mesa to the second side of the mesa, the current channel to convey injected current from the second side of the mesa to the first side of the mesa, and wherein the mesa further includes a resistive region adjacent to the current channel, wherein the resistive region is used to channel a current flow;
   wherein, at a first location along a length of the DFB laser, the current channel has a first width and the mesa has a second width as measured in a direction perpendicular to the length of the DFB laser; and
   wherein, at a second location along the length of the DFB laser, the current channel has a third width and the mesa has a fourth width as measured in a direction perpendicular to the length of the DFB laser.

2. The DFB laser of claim 1, wherein the mesa includes a III-V semiconductor material.

3. The DFB laser of claim 2, wherein the III-V semiconductor material includes indium phosphide (InP).

4. The DFB laser of claim 1, wherein the resistive region is a proton implanted portion.

5. The DFB laser of claim 1, wherein the first width is greater than the third width, and the second width is greater than the fourth width.

6. The DFB laser of claim 5, wherein the first location is at a mid-section along the length of the mesa and the second location is at an end section along the length of the mesa.

7. The DFB laser of claim 1, wherein the current channel includes a first layer adjacent to the second side of the mesa, and a second layer positioned between the first layer and the SOI platform, wherein the second layer has a fifth width that is substantially constant along the length of a waveguide.

8. The DFB laser of claim 7, wherein the fifth width is approximately identical to a width of an optical mode of light that is to propagate through the DFB laser.

9. The DFB laser of claim 1, wherein the contact is a p-contact.

10. A mesa for a hybrid silicon distributed feed-back (DFB) laser, wherein light is to propagate through the DFB laser along a length of a waveguide of the DFB laser, the mesa comprising:
    a first side;
    a second side opposite the first side;
    a current channel that extends from the first side to the second side, the current channel to convey injected current from the first side of the mesa to the second side to the mesa; and
    a proton implanted portion adjacent to the current channel;
    wherein, at a first location along the length of the waveguide, the current channel has a first width as measured in a direction perpendicular to the length of the waveguide; and
    wherein, at a second location along the length of the waveguide, the current channel has a second width as measured in a direction perpendicular to the length of the waveguide.

11. The mesa of claim 10, wherein the mesa includes a III-V semiconductor material.

12. The mesa of claim 10, wherein the first width is greater than the second width.

13. The mesa of claim 10, wherein the current channel includes a first layer adjacent to the first side of the mesa, and a second layer positioned between the first layer and the second side of the mesa, wherein the second layer has a third width that is substantially constant along the length of the waveguide.

14. A mesa for a distributed feed-back (DFB) laser, wherein light is to propagate through the DFB laser along a length of a waveguide of the DFB laser, the mesa comprising:
    a first side;
    a second side opposite the first side;
    a current channel that extends from the first side of the mesa to the second side of the mesa, the current channel to convey injected current from the first side of the mesa to the second side of the mesa; and
    a proton implanted portion adjacent to the current channel;
    wherein, at a first location along the length of the waveguide, the mesa has a first width as measured in a direction perpendicular to the length of the waveguide; and
    wherein, at a second location along the length of the waveguide, the mesa has a second width as measured in a direction perpendicular to the length of the waveguide.

15. The mesa of claim 14, wherein the mesa includes a III-V semiconductor material.

16. The mesa of claim 14, wherein the first width is greater than the second width.

17. The mesa of claim 16, wherein the first width and the second width are based on a thermal impedance characteristic of the mesa at the first location and the second location.

* * * * *